(12) United States Patent
Chan et al.

(10) Patent No.: US 7,982,293 B2
(45) Date of Patent: Jul. 19, 2011

(54) MULTI-CHIP PACKAGE INCLUDING DIE PADDLE WITH STEPS

(75) Inventors: Wei Kee Chan, Kuala Lumpur (MY); Weng Shyan Aik, Tampin (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/434,343

(22) Filed: May 1, 2009

(65) Prior Publication Data
US 2009/0250797 A1  Oct. 8, 2009

Related U.S. Application Data

(63) Continuation of application No. PCT/IB2006/003118, filed on Nov. 6, 2006.

(51) Int. Cl.
*H01L 23/495* (2006.01)
*H01L 21/98* (2006.01)
*H05K 7/18* (2006.01)

(52) U.S. Cl. ......... 257/676; 257/E23.052; 257/E21.705; 257/E23.037; 257/E23.04; 257/699; 257/712; 257/713; 257/717; 257/720; 257/670; 361/813; 438/107

(58) Field of Classification Search ............... 257/676, 257/E23.052, 699, 675, 712, 713, 717, 720, 257/E23.037, E23.04, E21.705, 685, 723, 257/670, 787; 361/813; 438/107
See application file for complete search history.

(56) References Cited

U.S. PATENT DOCUMENTS

| 5,049,977 | A | * | 9/1991 | Sako | 257/676 |
| 5,789,816 | A | | 8/1998 | Wu | |
| 6,333,549 | B2 | | 12/2001 | Drehobl et al. | |
| 7,633,143 | B1 | * | 12/2009 | Fan | 257/676 |
| 7,714,455 | B2 | * | 5/2010 | Son et al. | 257/787 |
| 2001/0029061 | A1 | | 10/2001 | Carlson et al. | |
| 2001/0042912 | A1 | | 11/2001 | Huang | |
| 2002/0149103 | A1 | | 10/2002 | Yang et al. | |
| 2003/0122247 | A1 | | 7/2003 | Joshi | |
| 2003/0193080 | A1 | | 10/2003 | Cabahug et al. | |
| 2004/0201086 | A1 | | 10/2004 | Joshi | |
| 2005/0287701 | A1 | | 12/2005 | Huang | |
| 2007/0132112 | A1 | * | 6/2007 | Ozaki et al. | 257/787 |
| 2007/0170600 | A1 | * | 7/2007 | Nishimura et al. | 257/784 |
| 2007/0296069 | A1 | * | 12/2007 | Terui et al. | 257/676 |
| 2008/0197465 | A1 | * | 8/2008 | Fujiwara | 257/676 |
| 2009/0191702 | A1 | * | 7/2009 | Nishimura et al. | 438/617 |
| 2009/0278248 | A1 | * | 11/2009 | Matsumura | 257/690 |

FOREIGN PATENT DOCUMENTS

| EP | 1187201 A1 | | 3/2002 |
| JP | 09283687 | | 10/1997 |
| JP | 10200023 | | 7/1998 |
| JP | 11-251510 | * | 9/1999 |
| JP | 2000208672 | | 7/2000 |

* cited by examiner

*Primary Examiner* — Alexander O Williams
(74) *Attorney, Agent, or Firm* — Edell, Shapiro & Finnan, LLC

(57) ABSTRACT

A lead frame assembly includes at least one die paddle. The die paddle includes a first landing area for receiving a first semiconductor chip and a second landing area for receiving a second semiconductor chip. One or more steps are provided between the first landing area and the second landing area.

20 Claims, 2 Drawing Sheets

MULTI-CHIP PACKAGE INCLUDING DIE PADDLE WITH STEPS

CROSS REFERENCE TO RELATED APPLICATIONS

This application is a continuation of International Application No. PCT/IB2006/003118, filed on Nov. 6, 2006, entitled "A Multi-Chip Package," the entire contents of which are hereby incorporated by reference.

FIELD OF THE INVENTION

This invention relates to a multiple semiconductor chip package.

BACKGROUND

A multiple chip package allows multiple chips to be mounted onto a single die paddle of a lead frame. The functionality of a single-chip package is limited to the semiconductor chip within the package. The functionality can be increased by re-designing the chip. However, this is usually a time consuming and expensive process. A multiple-chip package overcomes this limitation by allowing additional chips to be included in the package.

SUMMARY

The invention provides a lead frame assembly, which includes one or more die paddles. At least one of the die paddles comprises a first landing area for receiving a first semiconductor chip and a second landing area for receiving a second semiconductor chip. The landing area can have a recessed portion for example for aligning purposes. One or more steps are provided between the first landing area and the second landing area. A layer of chip adhesive bonds the semiconductor chips to the landing areas.

The die pad allows the semiconductors chips that are mounted on the die paddle to share a common ground that is near to the semiconductor chips. It is believed that semiconductor chips with a near common ground have a low ground noise. Analog and high frequency circuits are sensitive to such ground noise, so the invention provides advantages for such applications.

The first and the second semiconductor chips may be different. The difference can be in type, such as working frequency and analog or digital technology or in size.

In one embodiment of the invention, a single step is provided between the first landing area and the second landing area. The level of the first landing area is then lower than the level of the second landing area. The first semiconductor chip is bonded onto the lower first landing area before the second semiconductor chip is bonded onto the higher second landing area. This inhibits the first chip adhesive that is deposited on the first landing area from reaching the second landing area. There is no substantive flow of the chip adhesive from the first landing area to the second landing area, which would electrically short the electronic circuitry that is formed on the second semiconductor chip or cause the second semiconductor chip to tilt.

In another embodiment of the invention, two steps are provided between the first landing area and the second landing area. The two steps comprise a downward step and an upward step and they form a groove. The first and second landing areas may then be at approximately the same level. The groove inhibits the chip adhesive from flowing from one landing area onto the adjacent landing area. The length of the groove is preferably greater than the length of the semiconductor chip. The width of the groove is preferably greater than half the thickness of the semiconductor chip. The depth of the groove is preferably greater than half the thickness of the semiconductor chip.

The chip adhesive comprises a material that requires heating to activate its bonding property. The invention also makes sure that such heated chip adhesive does not electrically short the semiconductor chips when it is in its liquid state.

A method of fabricating a lead frame assembly according to the invention comprises providing a layer of first chip adhesive on the first chip landing area. After this, the first semiconductor chip is placed on the first chip landing area. Following this, the assembly is usually heated to activate the binding of the semiconductor chip onto the landing area. The chip adhesive comprises a bonding material that requires the application of heat to become active.

Then, a second layer of chip adhesive is deposited on a second chip landing area. The second chip landing area is adjacent to the first chip landing area. The second chip landing area is at the same level or higher than the first chip landing area. After this, the second semiconductor chip is placed on the second chip landing area. Then, the assembly is normally heated to enable the bonding of the second chip onto the second chip landing area to take place. This heating may cause the first layer of chip adhesive to melt and flow onto the second semiconductor chip. However, any substantive flow is inhibited by the difference in height of the top surfaces of the landing areas or by the groove.

DETAILED DESCRIPTION

Figure 1:
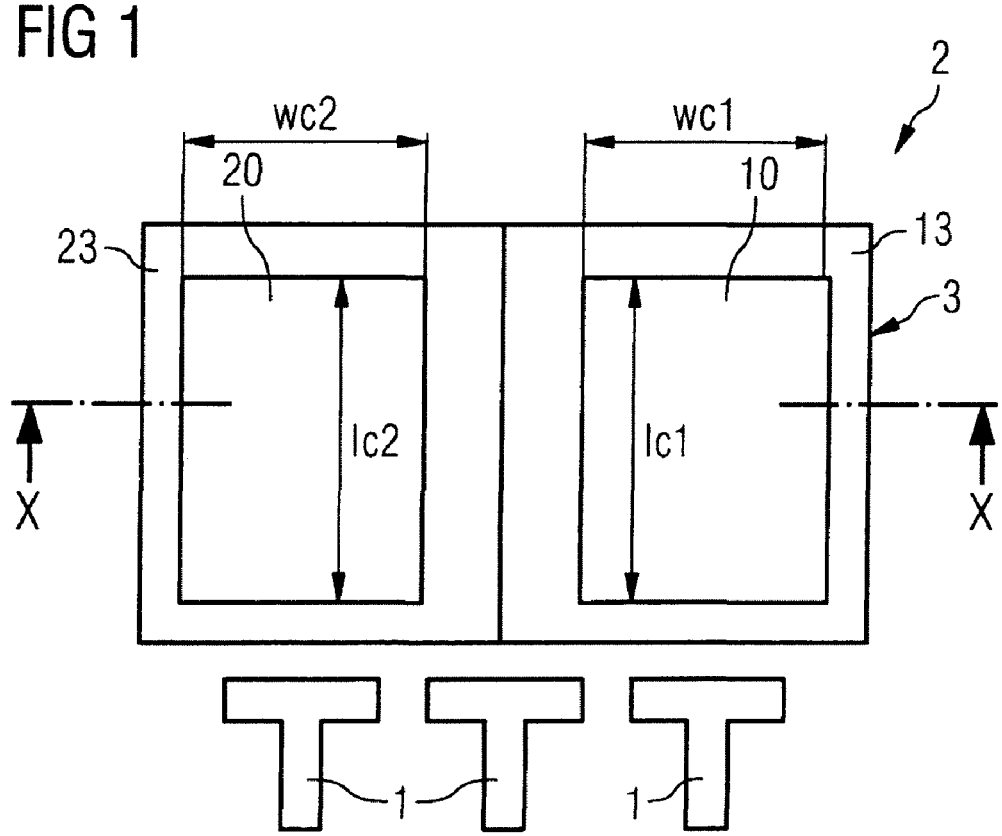
FIG. 1 shows a top plan view of a simplified lead frame assembly according to the invention.

FIG. 1 shows a top plan view of a simplified lead frame assembly 2 according to the invention. The lead frame assembly 2 includes a plurality of wire bond pads 1. A die paddle 3 is provided next to the wire bond pads 1 and it comprises a first landing area 13 and a second landing area 23. Over the first landing area 13 is placed a first semiconductor chip 10. Above the second landing area 23 is placed a second semiconductor chip 20.

A plurality of the wire bond pads 1 surround the die paddle 3. The FIG. 1 shows only a portion of the wire bond pads 1. The die paddle 3 and the wire bond pads 1 may comprise copper material.

Figure 2:
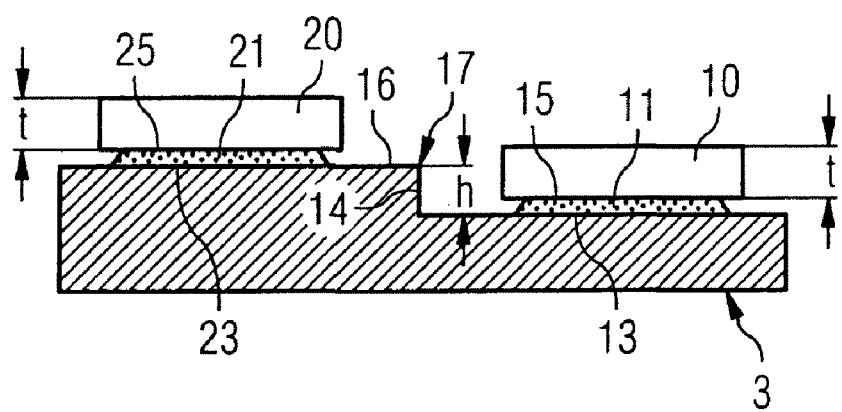
FIG. 2 shows a cross-sectional view of the lead frame assembly of the FIG. 1 taken along the line of X-X.

FIG. 2 shows a cross-sectional view of the lead frame assembly 2 of FIG. 1 taken along the line of X-X. A first layer of chip adhesive 11 is interposed between the first semiconductor chip 10 and the first landing area 13. A second layer of chip adhesive 21 is placed between the second semiconductor chip 20 and the second landing area 23.

The second landing area 23 is higher than the first landing area 13 and is separated from the first landing area 13 by a step 17. The step 17 comprises a tread 16 and a riser 14. The height h of the riser 14 is approximately 100 μm (micrometers).

The first semiconductor chip 10 has a length lc1 of about 4550 µm, a width wc1 of about 3200 µm, and a thickness t of about 100 µm. The bottom surface 15 of the first semiconductor chip 10 is about 30 µm above the first landing area 13. The second semiconductor chip 20 has a length lc2 of about 1120 µm, a width wc2 of about 1104 µm, and a thickness t of about 100 µm. The bottom surface 25 of the second semiconductor chip 20 is about 30 µm above the second landing area 23.

The first layer of chip adhesive 11 provides bonding and electrical and thermal conductivity between the first semiconductor chip 10 and the die paddle 3. Likewise, the second layer of chip adhesive 21 provides bonding and electrical and thermal conductivity between the second semiconductor chip 20 and the die paddle 3. The first and second layers of chip adhesive 11 and 21 comprise a material that requires heating to activate its bonding property.

The step 17 of die paddle 3 hinders or inhibits the first layer of chip adhesive 11 from flowing onto the second semiconductor chip 20. A flow of the first layer of chip adhesive 11 onto the second semiconductor chip 20 may lead to electrical shorts within the second semiconductor chip 20 or cause the second semiconductor chip 20 to be tilted, which is undesirable. The first and second landing areas 13 and 23 of the die paddle 3 are reserved for the placement of the first and second semiconductor chips 10 and 20.

The first and second semiconductor chips 10 and 20 comprise electronic circuitry and contact pads connected to the electronic circuitry. The electronic circuitry and the contact pads are not shown in the figure. The first and second semiconductor chips 10 and 20 comprise different electronic circuitry and different dimensions. In a later step, conductive wires are provided between the contact pads and the wire bond pads 1.

The wire bond pads 1 and the die paddle 3 are part of a metal strip respectively a lead frame, which is not shown in the figure. The metal strip prevents the wire bond pads 1 from shifting. During package encapsulation, the wire bond pads 1 and the die paddle 3 are covered with an encapsulating compound. The metal strip is separated and removed from the wire bond pads 1 after package encapsulation. After this, the wire bond pads 1 may be connected to an external substrate such as a printed circuit board.

A method of fabricating the lead frame assembly 2 comprises providing the lead frame. Then, a first layer of chip adhesive 11 is deposited on the first landing area 13 of the lead frame. After this, a first semiconductor chip 10 is placed over the first layer of chip adhesive 11. Then, the lead frame assembly 2 is heated for a certain period. This bonds the first semiconductor chip 10 to the first landing area 13 by activating the first layer of chip adhesive 11.

Following this, a second layer of chip adhesive 21 is deposited on the second landing area 23. Then, the second semiconductor chip 20 is placed over the second layer of chip adhesive 21. After this, the lead frame assembly 2 is heated for a predetermined length of time to activate the second layer of chip adhesive 21. This attaches the second semiconductor chip 20 to the second landing area 23. The heating of lead assembly 2 to bond the second semiconductor chip 20 to the second landing area 23 may also cause the first layer of chip adhesive 11 to go into a molten state. However, the first layer of chip adhesive 11 is inhibited from flowing onto the second semiconductor chip 20 by the step 17.

The second layer of chip adhesive 21, which was disposed at the second landing area 23 in the form of a lump during the time of the second step of heating, will spread out to the area shown in the FIG. 2.

The first layer of chip adhesive 11, which extended after the first heating step to the area shown in the FIG. 2, will still further extend during the second heating step. However, it will be stopped by the step 17.

After cooling of the lead frame assembly 2, the first layer of chip adhesive 11 covers most of the first landing area 13 while the second layer of chip adhesive 21 is located only under the second semiconductor chip 20.

Figure 3:
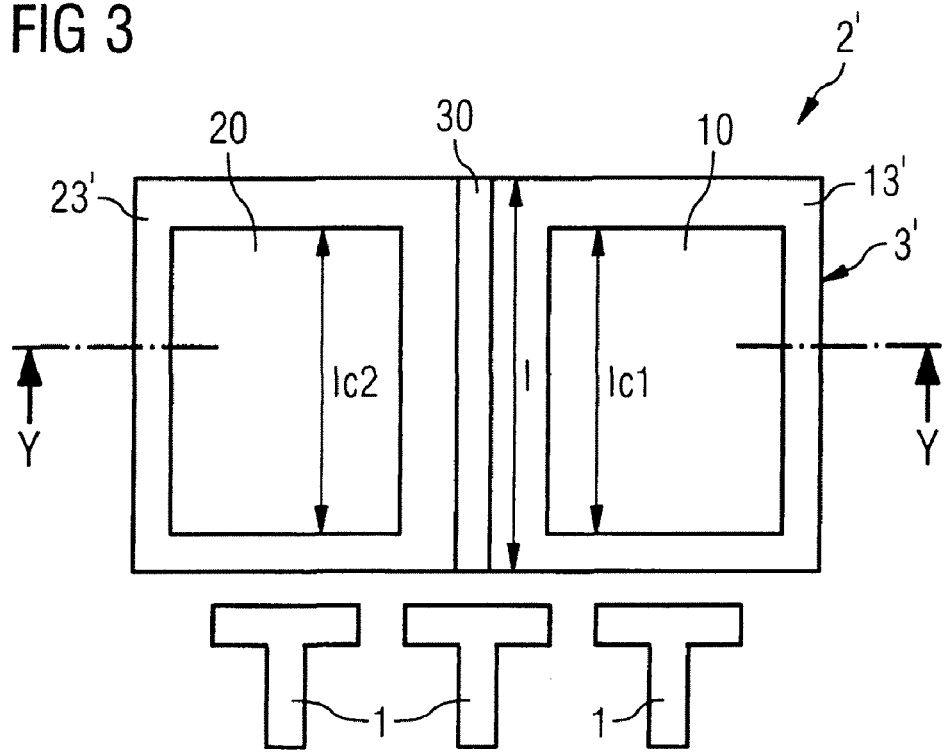
FIG. 3 shows a top plan view of a further simplified lead frame assembly according to the invention.

FIG. 3 shows a top plan view of a further simplified lead frame assembly 2'. FIG. 3 shows features similar to those shown in the FIG. 1. The similar features are denoted with the same reference numerals.

FIG. 3 shows a further die paddle 3'. The die paddle 3' includes a first landing area 13' and a second landing area 23'. A groove 30 is provided between the first and second landing areas 13' and 23'. A first semiconductor chip 10 is placed over the first landing area 13'. A second semiconductor chip 20 is placed above the second landing area 23'.

The groove 30 has a length h and length l. The length l is longer than the length lc1 of the first semiconductor chip 10 or the length lc2 of the second semiconductor chip 20.

Figure 4:
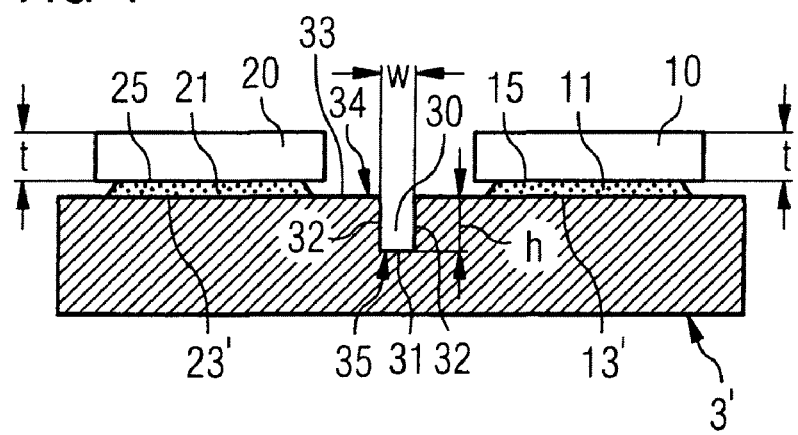
FIG. 4 shows a cross-sectional view of the lead frame assembly of the FIG. 3 taken along the line of Y-Y.

FIG. 4 shows a cross-sectional view of lead frame assembly 2' taken along the line of Y-Y. The first and second landing areas 13' and 23' are at about the same level.

The bottom surface 15 of the first semiconductor chip 10 is about 30 µm above the first landing area 13'. Likewise, the bottom surface 25 of the second semiconductor chip 20 is about 30 µm above the second landing area 23'.

The groove 30 has a depth h of about 100 µm and a width w of about 100 µm. The bottom surface 31 of the groove 30 is flat. The groove 30 comprises a downward step 35 and an upward step 34. The downward step 35 comprises a tread respectively bottom surface 31 and the upward step 34 comprises a tread 33.

A method of fabricating the lead frame assembly 2' is similar to the method of fabricating the lead frame assembly 2.

During the fabrication of the lead frame assembly 2', the lead frame assembly 2' is heated to bond the first semiconductor chip 10 to the first landing area 13'. In a later step, the lead frame assembly 2' is heated again to bond the second semiconductor chip 20 to the second landing area 23'. However, the first layer of chip adhesive 11 is hindered from flowing onto the second landing area 23' by the groove 30. Likewise, the second layer of chip adhesive 21 is hindered from flowing onto the first landing area 13' by the groove 30.

What is claimed is:

1. A lead frame assembly, comprising:
   at least one die paddle for receiving two or more semiconductor chips, the at least one die paddle comprising:
      a first landing area for receiving a first semiconductor chip;
      a second landing area for receiving a second semiconductor chip; and
      one or more steps between the first landing area and the second landing area,
   wherein the one or more steps comprise a portion that is vertical.

2. The lead frame assembly according to claim 1, wherein the lead frame assembly further comprises:
   a first layer of chip adhesive that bonds the first semiconductor chip to the first landing area; and
   a second layer of chip adhesive that bonds the second semiconductor chip to the second landing area.

3. The lead frame assembly according to claim 2, wherein the chip adhesive comprises a heat activated material.

4. The lead frame assembly according to claim 1, wherein the at least one die paddle comprises a single step.

5. The lead frame assembly according to claim 1, wherein the at least one die paddle comprises two or more steps.

6. The lead frame assembly according to claim 5, wherein the two steps form a groove.

7. The lead frame assembly according to claim 6, wherein at least part of a bottom surface of the groove is flat.

8. The lead frame assembly according to claim 1, wherein a length of the one or more steps is longer than lengths of the first and the second semiconductor chips.

9. The lead frame assembly according to claim 1, wherein a height of the one or more steps is greater than half a thickness of the first and second semiconductor chips.

10. A semiconductor package comprises a lead frame assembly according to claim 1.

11. The semiconductor package according to claim 10, wherein the semiconductor package further comprises the first semiconductor chip on the first landing area and the second semiconductor chip on the second landing area.

12. A lead frame assembly comprising at least one die paddle for receiving two or more semiconductor chips, the at least one die paddle comprising:
    a first landing area for receiving a first semiconductor chip;
    a second landing area for receiving a second semiconductor chip; and
    two or more steps arranged between the first landing area and the second landing area.

13. The lead frame assembly according to claim 12, wherein the lead frame assembly further comprises:
    a first layer of chip adhesive that bonds the first semiconductor chip to the first landing area; and
    a second layer of chip adhesive that bonds the second semiconductor chip to the second landing area.

14. The lead frame assembly according to claim 13, wherein the chip adhesive comprises a heat activated material.

15. The lead frame assembly according to claim 12, wherein the two steps form a groove.

16. The lead frame assembly according to claim 15, wherein at least part of a bottom surface of the groove is flat.

17. The lead frame assembly according to claim 12, wherein the one or more steps comprise a portion that is vertical.

18. The lead frame assembly according to claim 12, wherein a length of the one or more steps is longer than lengths of the first and the second semiconductor chips.

19. The lead frame assembly according to claim 12, wherein a height of the one or more steps is greater than half a thickness of the first and second semiconductor chips.

20. A semiconductor package comprising a lead frame assembly according to claim 12, wherein the semiconductor package further comprises the first semiconductor chip on the first landing area and the second semiconductor chip on the second landing area.

* * * * *